United States Patent
Al Masri et al.

(10) Patent No.: US 10,930,409 B2
(45) Date of Patent: Feb. 23, 2021

(54) RESIN COMPOSITIONS COMPRISING SORBIC ESTERS

(71) Applicant: Elantas GmbH, Wesel (DE)

(72) Inventors: Majdi Al Masri, Buchholz (DE); Anne-Gönke Huesmann, Volsemenhusen (DE); Klaus-Wilhelm Lienert, Hamburg (DE); Hans-Ulrich Moritz, Bendestorf (DE)

(73) Assignee: ELANTAS GMBH, Wesel (DE)

( * ) Notice: Subject to any disclaimer, the term of this patent is extended or adjusted under 35 U.S.C. 154(b) by 120 days.

(21) Appl. No.: 15/949,763

(22) Filed: Apr. 10, 2018

(65) Prior Publication Data

US 2018/0233251 A1    Aug. 16, 2018

Related U.S. Application Data

(62) Division of application No. 14/114,055, filed as application No. PCT/EP2012/056120 on Apr. 4, 2012, now Pat. No. 9,972,415.

(30) Foreign Application Priority Data

Apr. 28, 2011    (DE) .................... 10 2011 017 708.6

(51) Int. Cl.
| | |
|---|---|
| C08L 63/10 | (2006.01) |
| H01B 3/40 | (2006.01) |
| C08G 59/16 | (2006.01) |
| C09D 163/10 | (2006.01) |
| H01L 23/29 | (2006.01) |
| H01F 41/12 | (2006.01) |
| C08K 5/00 | (2006.01) |
| C08K 5/09 | (2006.01) |

(52) U.S. Cl.
CPC ........... *H01B 3/40* (2013.01); *C08G 59/1461* (2013.01); *C08L 63/10* (2013.01); *C09D 163/10* (2013.01); *H01F 41/127* (2013.01); *H01L 23/293* (2013.01); *C08K 5/0025* (2013.01); *C08K 5/09* (2013.01); *H01L 2924/0002* (2013.01)

(58) Field of Classification Search
CPC ..... C08G 59/1461; C08L 63/10; C08L 33/10; C08L 33/08; C09D 163/10
See application file for complete search history.

(56) References Cited

U.S. PATENT DOCUMENTS

| | | | |
|---|---|---|---|
| 3,825,517 A | 7/1974 | Ficarra | |
| 3,876,432 A | 4/1975 | Carlick et al. | |
| 3,980,483 A | 9/1976 | Nishikubo et al. | |
| 4,888,269 A | 12/1989 | Sato et al. | |
| 5,318,651 A * | 6/1994 | Matsui | H01L 24/81 |
| | | | 156/273.3 |
| 5,984,647 A | 11/1999 | Miyamoto et al. | |
| 2002/0184745 A1 | 12/2002 | Ringdahl | |
| 2008/0256783 A1 | 10/2008 | Alfermann et al. | |

FOREIGN PATENT DOCUMENTS

| | | |
|---|---|---|
| DE | 2316563 A1 | 12/1973 |
| GB | 1407898 A | 10/1975 |
| JP | 2008-63528 A | 3/2008 |
| JP | 2008063528 * | 3/2008 |

OTHER PUBLICATIONS

JP 2008 063528 machine translation (2008).*
JP 2008063528 A, DERWENT Abstract, 2008, p. 1-5.
JP 2008063528 A, JPO Machine Translation, originally published Mar. 2008, p. 1-12.

* cited by examiner

*Primary Examiner* — Kuo Liang Peng
(74) *Attorney, Agent, or Firm* — Birch, Stewart, Kolasch & Birch, LLP

(57) ABSTRACT

Resin composition comprising a) the reaction product of a1) one or more epoxy compounds having at least 2 epoxy groups, and a2) sorbic acid as component A; b) a solvent containing vinyl groups as component B; characterized in that a bisphenol F diglycidyl ether or an epoxy novolac is used as epoxy compound a1) in component A.

4 Claims, No Drawings

RESIN COMPOSITIONS COMPRISING SORBIC ESTERS

This application is a divisional of co-pending U.S. patent application Ser. No. 14/114,055 filed on Jan. 6, 2014, which is the national phase of PCT International Application No. PCT/EP2012/056120 filed on Apr. 4, 2012, which claims the benefit of German Patent Application No. 10 2011 017 708.6 filed on Apr. 28, 2011. The entire contents of all of the above applications are hereby incorporated by reference.

The invention relates to resin compositions comprising sorbic esters, to coating compositions comprising them, and to the use thereof for insulation of electrical and electronic components and devices.

Standard liquid compositions currently being used for electrical insulation are those based on unsaturated polyesters (UP) or epoxy resins (EP).

UP systems which are used as impregnating resins comprise a reactive diluent, for example styrene, and thus cause correspondingly high monomer emissions during curing, or they are monomer-free with the associated higher viscosity. The free-radical polymerization is typically initiated with the use of a thermal free-radical initiator or by irradiation with UV light.

The epoxy resin systems used are hardened under cold or hot conditions. The hardener components used in the case of the cold-hardening systems are polyamines and derivatives thereof, for example polyamidoamines. In the hot-hardening systems, either acid anhydrides or, in the case of catalytic hardening, Lewis acids, for example $BCl_3$-amine complexes, are used.

A comparatively extensive description of polymers used as impregnating resins can be found in Horst Sulzbach (editor), "Polymers for Electrical Insulation", Verlag Moderne Industrie 2008, ISBN 978-3-937889-82-5 and the further citations therein.

Epoxy vinyl esters have many of the advantageous properties of epoxy resin systems, such as good processability and chemical resistance, and can additionally be diluted in acrylic solvents with very low VOC contents (VOC=volatile organic compounds). U.S. Pat. No. 5,984,647 describes the use of such systems for the impregnation of a hermetic motor. However, the adhesive strengths of these systems do not reach the values possible in principle with epoxy resin systems.

The UV hardening properties of epoxy resin compositions with only partly converted epoxy groups are described by Saiki et al. in Journal of Applied Polymer Science 117 (2010) 3466-3472 and by Park et al. in International Journal of Adhesives & Adhesives 29 (2009) 710-717.

It is an object of the present invention to provide an impregnating resin system which has good adhesion properties, hardens rapidly and comprises only small amounts of VOCs.

The object is achieved by a resin composition comprising
a) the reaction product of
   a1) one or more epoxy compounds having at least 2 epoxy groups, and
   a2) sorbic acid as component A;
b) a solvent containing vinyl groups
   as component B.

It has been found that, surprisingly, resin compositions comprising sorbic esters are suitable as impregnating resins with good adhesive strengths. The systems can be hardened by addition of hardeners, and the corresponding gel times are short. The impregnations have a homogeneous appearance and feature high bond strengths.

Thus, in accordance with the invention, resin systems are provided for electrical insulation with excellent thermal stability, adhesion and electrical insulation properties in the hardened state. The resin can be used alone or in combination with solid insulation materials (tapes etc) to insulate electrical devices such as motors, transformers and generators.

The object is further achieved by coating compositions comprising
   i) 100 parts by weight of a resin composition, and
   ii) 1 to 3 parts by weight of a free-radical-forming polymerization initiator.

The inventive resin compositions comprise a reaction product of one or more epoxy-functional compounds having at least 2 epoxy groups and sorbic acid. This reaction product is diluted with a solvent containing vinyl groups.

Suitable epoxy-functional compounds having at least 2 epoxy groups are, for example, bisphenol A diglycidyl ethers of the following formula:

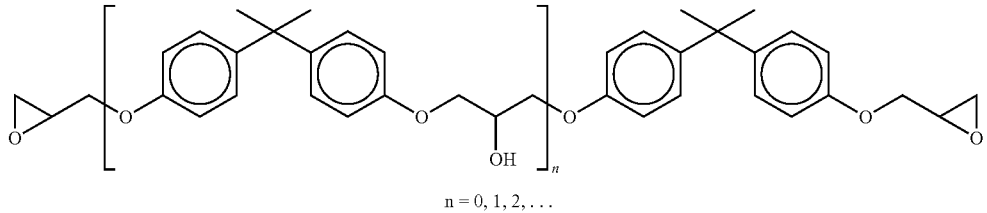

n = 0, 1, 2, ...

where n is in the range from 0 to 10, preferably 0 to 8, more preferably 0 to 6, or bisphenol F diglycidyl ethers of the following formula:

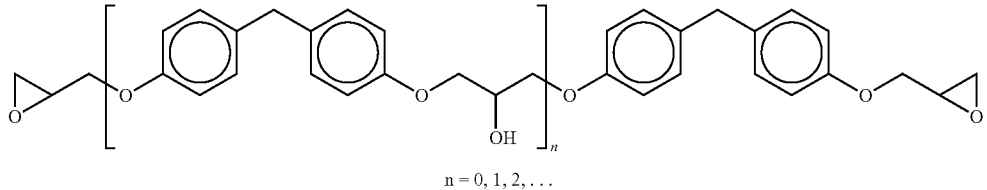

n = 0, 1, 2, ...

where n is in the range from 0 to 5, preferably 0 to 4, more preferably 0 to 3.

Further suitable epoxy-functional compounds having at least 2 epoxy groups are, for example, epoxy compounds based on phenol novolac or cresol novolac. Suitable epoxy novolacs generally have a melting point in the range from 60 to 120° C., preferably 70 to 100° C., and contain an average of 2 to 20 and preferably 3 to 10 epoxy groups per molecule.

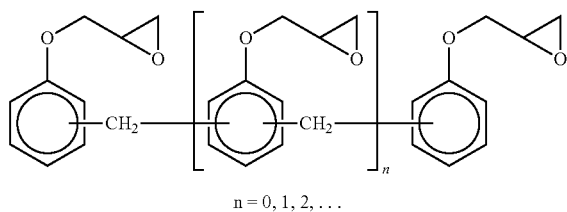

n = 0, 1, 2, ...

Preferred epoxy-functional compounds having at least 2 epoxy groups are the bisphenol A diglycidyl ether where n=0 and the higher molecular weight homologues thereof.

Suitable solvents containing vinyl groups—also referred to as reactive diluents—are monofunctional, difunctional and polyfunctional reactive diluents. Examples of reactive diluents are acrylates, methacrylates and vinyl ethers. (Meth)acrylates are especially preferred.

Suitable acrylates and methacrylates are generally the (meth)acrylates of monoalcohols, diols and polyols. Preference is given to the (meth)acrylates of monoalcohols, for example hydroxyethyl (meth)acrylate, hydroxypropyl (meth)acrylate, butyl (meth)acrylate, hexyl (meth)acrylate, octyl (meth)acrylate, and the (meth)acrylates of diols, for example butanediol di(meth)acrylate, hexanediol di(meth)acrylate, diethylene glycol di(meth)acrylate, triethylene glycol di(meth)acrylate, dipropylene glycol di(meth)acrylate and tripropylene glycol di(meth)acrylate.

Unsaturated polyester resins are known per se and are prepared by the reaction of polyols, polyfunctional unsaturated carboxylic acids and optionally monofunctional compounds as chain terminators. The preparation of the unsaturated polyester resins is common knowledge. This involves heating the components with or without esterification catalysts typically to temperatures between 160 and 200° C. The reaction is typically performed under protective gas. The water formed in the condensation reaction can be distilled off as an azeotrope using a suitable solvent or removed by vacuum distillation. The progress of the reaction is typically monitored by determining the acid number and/or the viscosity.

Polyols preferred for preparation of the unsaturated polyesters are selected from ethylene glycol, propane-1,3-diol, 2-methylpropane-1,3-diol, di- and triethylene glycol, neopentyl glycol, hexane-1,3- and -1,6-diol, perhydrobisphenol A, glycerol, trimethylolpropane, tris(2-hydroxyethyl) isocyanurate, pentaerythritol and dipentaerythritol. Preference is given to di- and triethylene glycol, 2-methylpropane-1,3-diol, glycerol, neopentyl glycol and trimethylolpropane.

Unsaturated carboxylic acids preferred for preparation of the unsaturated polyesters are α,β-unsaturated dicarboxylic acids and anhydrides thereof, such as maleic acid, maleic anhydride and fumaric acid. Preference is further given to mixtures of α,β-unsaturated dicarboxylic acids with further modifying dicarboxylic acids, preferably with saturated aliphatic or aromatic dicarboxylic acids and anhydrides thereof, such as adipic acid, succinic acid, phthalic anhydride, isophthalic acid, terephthalic acid and naphthalene-2,6-dicarboxylic acid. Preference is given to maleic anhydride and to mixtures of maleic anhydride and adipic acid.

The chain terminators used in addition are generally monofunctional carboxylic acids or monofunctional alcohols, for example tall oil fatty acid, benzoic acid, 2-ethylhexanoic acid, hexanol, 2-ethylhexanol, benzyl alcohol, tert-butanol and isoprenol (3-methyl-3-buten-1-ol). Preference is given to additional conversion of hexanol, isoprenol and the reaction product of tetrahydrophthalic anhydride with ethanolamine as chain terminators.

The unsaturated polyester resins may be modified with terminal or lateral imide groups. Terminal imide groups can be introduced, for example, by reaction with the reaction product of tetrahydrophthalic anhydride and ethanolamine. These and further suitable monofunctional compounds which have imide groups and function as chain terminators are described in DE-A 1 570 273.

Lateral imide groups can be introduced, for example, by reaction with compounds containing imide groups. These are obtained by reaction between compounds where one compound has a carboxylic anhydride group and a further functional group, while the other compound has a primary amino group and a further functional group. These further functional groups are those which can react with the polyol or polycarboxylic acid components of the unsaturated polyester resin with incorporation into the polymer chain. In general, these further functional groups are carboxylic acid groups or hydroxyl groups. However, primary amino groups or carboxylic anhydride groups may also be present as further functional groups in these compounds. Suitable compounds are described in DE 1 720 323.

Suitable compounds having a carboxylic anhydride group and a further functional group are pyromellitic dianhydride and trimellitic anhydride. However, other aromatic carboxylic anhydrides are also useful, for example the naphthalenetetracarboxylic dianhydrides or dianhydrides of tetracarboxylic acids having two benzene rings in which the carboxyl groups are in the 3,3',4 and 4' positions.

Examples of compounds having primary amino groups are especially di-primary amines, for example ethylenediamine, tetramethylenediamine, hexamethylene-diamine, nonamethylenediamine and other aliphatic di-primary diamines.

In addition, aromatic di-primary diamines are useful, such as benzidine, diaminodiphenyl, diaminodiphenyl sulphone, diaminodiphenyl sulphoxide, diaminodiphenyl ether and diaminodiphenyl thioether, phenylenediamines, tolylenediamines and diamines having three benzene rings in the molecule, for example bis(4-aminophenoxy)-1,4-benzene.

Finally, cycloaliphatic diamines such as 4,4'-dicyclohexylmethanediamine are an option.

For example, it is possible to introduce imide groups into the polymer chain by reaction with compounds obtainable by reaction of 1 mol of trimellitic anhydride with 2 mol of the di-primary diamines mentioned.

Suitable amino-containing compounds having a further functional group are amino alcohols, for example monoethanolamine and monopropanolamines, and also aminocarboxylic acids such as glycine, aminopropanoic acid, aminocaproic acids or aminobenzoic acids.

For example, it is also possible to introduce imide groups into the polymer chain by reaction with compounds obtainable by reaction of 1 mol of pyromellitic dianhydride and 2 mol of the amino alcohols or aminocarboxylic acids mentioned.

For example, it is also possible to introduce imide groups into the polymer chain by reaction with compounds obtainable by reaction of 1 mol of trimellitic anhydride with 1 mol of the aminocarboxylic acids mentioned.

Suitable styrene derivatives are, for example, styrenes substituted on the double bond or on the ring, such as alpha-methylstyrene, vinyltoluene or tert-butylstyrene.

Trifunctional or polyfunctional reactive diluents can also be used together with difunctional reactive diluents to increase the crosslinking density.

Suitable polyfunctional reactive diluents are, for example, the (meth)acrylic esters of trimethylolpropane, pentaerythritol or dipentaerythritol, or the allyl alcohol esters of trimellitic acid or pyromellitic acid.

The epoxy-functional compounds are reacted in the presence of an esterification catalyst with sorbic acid at temperatures of generally 60 to 140° C., preferably 80 to 120° C. Suitable esterification catalysts are, for example, triethylamine, dimethylbenzylamine, imidazole, triphenylphosphine, triphenylantimony, tetrabutyl-ammonium chloride or chromium (III) diisopropylsalicylate.

In order to prevent the double bonds of the sorbic acid (ester groups) from reacting prematurely with one another in the course of the esterification reaction, it is possible to add inhibitors. Suitable inhibitors are, for example, alkylated phenols, hydroquinones or quinones. Preference is given to hydroquinone.

The esterification can be performed in a solvent. Suitable solvents are, for example, dimethylformamide, cyclohexane or aromatic solvents such as toluene, ethylbenzene, xylene, cumene, Solvent Naphtha®, heavy benzene, various Solvesso® products, various Shellsol® products or Deasol®. Preference is given to toluene. The solvent is removed after the reaction has ended, preferably by means of distillation under reduced pressure.

In general, the inventive resin compositions comprise 10 to 100% by weight, preferably 30 to 70% by weight, especially preferably 40 to 60% by weight, of reaction product of epoxy compound and sorbic acid (component A), and 0 to 90% by weight, preferably 30 to 70% by weight, especially preferably 40 to 60% by weight, of solvent containing vinyl groups (reactive diluent, component B), where the sum of components A and B adds up to 100% by weight.

To prevent premature hardening of the resin compositions, it is possible to add stabilizers.

Suitable stabilizers are, for example, alkylated phenols, hydroquinones or quinones. Preference is given to p-benzoquinone.

In a preferred embodiment of the invention, the resin composition is characterized in that the epoxy groups present in component A are reacted completely with sorbic acid.

A complete reaction of the epoxy groups present in component A with sorbic acid, in the context of the invention, means that at least 95%, preferably 98%, more preferably 99% and most preferably 100% of the epoxy groups present in component A have reacted with sorbic acid.

The resin compositions, in the preferred embodiment, contain sorbic ester groups and are hardened by crosslinking the double bonds of the sorbic ester groups by means of a polymerization initiator which is activatable by heat or UV light and forms free radicals. In general, these initiators are used in amounts of 1 to 3% by weight, based on the resin composition.

Suitable free-radical-forming polymerization initiators are the polymerization initiators known to those skilled in the art.

Preferred polymerization initiators activatable by means of UV light are 4,4'-dimethylbenzyl ketal, 4,4'-dimethoxybenzoin, benzoin methyl ether and 2,4,6-tri-methylbenzoyldiphenylphosphine oxide.

Preferred polymerization initiators activatable by means of heat are dicumyl peroxide, di-tert-butyl peroxide and tert-butyl perbenzoate.

The inventive resin compositions are introduced into the winding of an electrical machine by means of methods known to those skilled in the art. Suitable methods for impregnation are, for example, impregnation by dipping, dip-rolling, trickling or pouring, vacuum impregnation or vacuum-pressure impregnation. The hardening can be effected, for example, thermally in an oven, or by means of the Joule heat produced in a winding. In addition, curing can be effected by irradiation with UV light on the laminate stack. A combination of various methods for hardening is likewise possible. One example thereof is the combination of Joule heat and irradiation.

The invention further provides for the use of the resin compositions and of the coating compositions for insulation of electrical and electronic components and devices. The invention relates more particularly to the use of the compositions and coating compositions for impregnation of electrical windings, for example of rotors, stators, transformers and inductors.

The invention is illustrated in detail by the examples which follow.

EXAMPLES

Example 1

A three-neck flask with thermometer, stirrer and reflux condenser is charged with 600 g of a bisphenol A diglycidyl ether (of low molecular weight compared to Example 2) (epoxy equivalent of 184-190 g), 350 g of sorbic acid, 14.6 g of dimethylbenzylamine and 2 g of hydroquinone. The mixture is heated at 100° C. under nitrogen until the mixture has an acid number below 1 mg KOH/g.

Example 2

A three-neck flask with thermometer, stirrer and reflux condenser is charged with 900 g of a bisphenol A diglycidyl ether (of higher molecular weight compared to Example 1) (epoxy equivalent of 806-909 g), 125 g of sorbic acid, 21 g of dimethylbenzylamine, 3 g of hydroquinone and 270 g of toluene. The mixture is heated at 100° C. under nitrogen until the mixture has an acid number below 5 mg KOH/g. The toluene solvent is removed by distillation under reduced pressure.

Example 3

A three-neck flask with thermometer, stirrer and reflux condenser is charged with 600 g of bisphenol F diglycidyl ether, 396 g of sorbic acid, 14.6 g of dimethylbenzylamine and 2 g of hydroquinone. The mixture is heated at 100° C. under nitrogen until the mixture has an acid number below 1 mg KOH/g.

Example 4

A three-neck flask with thermometer, stirrer and reflux condenser is charged with 480 g of a phenol novolac glycidyl ether (epoxy equivalent 174.3 g), 307.8 g of sorbic acid, 14.6 g of dimethylbenzylamine, 1.6 g of hydroquinone and 200 g of toluene. The mixture is heated at 110° C. under nitrogen until the mixture has an acid number below 1 mg KOH/g.

Example 5

500 g of resin from Example 1, 500 g of hydroxyethyl methacrylate and 0.001 g of p-benzoquinone are mixed with one another. The corresponding impregnation resin exhibits a viscosity of 290 mPa·s at 23° C. With 2% by weight of tert-butyl perbenzoate at 120° C., the gel time is 3 min.

The gel time is determined to DIN 16945.

Examples 6 and 7

The resins from Examples 6 and 7 are, as described in Example 5, prepared with the methacrylates listed in Table 1.

TABLE 1

|  | Example | | |
| --- | --- | --- | --- |
|  | 5 | 6 | 7 |
| Resin from Example 1 in g | 500 | 500 | 500 |
| Hydroxyethyl methacrylate in g | 500 |  |  |
| Hydroxypropyl methacrylate in g |  | 500 |  |
| Triethylene glycol dimethacrylate in g |  |  | 500 |
| Viscosity in mPa · s at 23° C. | 290 | 600 | 700 |
| Gel time with 2% by weight of tert-butyl perbenzoate at 120° C. in min | 3.0 | 3.4 | 2.5 |

The resin from Example 7 has a bond strength of 400 N at 23° C. and 130 N at 155° C.

The bond strength is determined to IEC 61033.

Example 8

308 g of maleic anhydride, 114 g of adipic acid, 92 g of hexanediol, 72 g of glycerol, 409 g of hexanol and 0.3 g of hydroquinone are used to prepare an unsaturated polyester having an acid number below 20 mg KOH/g.

This unsaturated polyester is mixed in a ratio of 1:1 with the resin from Example 1. The corresponding impregnation resin is stabilized with 0.001% p-benzoquinone and exhibits a viscosity of 17 800 mPa·s at 23° C. With 2% by weight of tert-butyl perbenzoate at 120° C., the gel time is 7.5 min.

The resin from Example 8 has a bond strength of 190 N at 23° C. and 50 N at 155° C.

Example 9

500 g of resin from Example 2, 500 g of triethylene glycol dimethacrylate and 0.001 g of p-benzoquinone are mixed with one another. The corresponding impregnation resin shows a viscosity of 12 800 mPa·s at 23° C. With 2% by weight of tert-butyl perbenzoate at 120° C., the gel time is 2.5 min.

The resin from Example 9 has a bond strength of 470 N at 23° C. and 57 N at 155° C.

Example 10

500 g of resin from Example 4, 500 g of triethylene glycol dimethacrylate and 0.001 g of p-benzoquinone are mixed with one another. The corresponding impregnation resin shows a viscosity of 980 mPa·s at 23° C. With 2% by weight of tert-butyl perbenzoate at 120° C., the gel time is 2.5 min.

The resin from Example 10 has a bond strength of 450 N at 23° C. and 170 N at 155° C.

Example 11

450 g of resin from Example 1, 50 g of resin from Example 4, 500 g of hydroxypropyl methacrylate and 0.001 g of p-benzoquinone are mixed with one another. The corresponding impregnation resin shows a viscosity of 480 mPa·s at 23° C. With 2% by weight of tert-butyl perbenzoate at 120° C., the gel time is 3.75 min.

The resin from Example 11 has a bond strength of 300 N at 23° C. and 95 N at 155° C.

The resins from Examples 5 to 11 are used to impregnate size 90 stators containing copper windings. In the case of the resins from Examples 8 and 9, the resin was preheated to 40° C., and this was then used to impregnate the stators. After a dripping phase of 20 min, the resins were hardened at 160° C. for two hours.

Subsequently, the stators were sawn open. All stators showed bubble-free through-impregnation of the copper windings.

The invention claimed is:
1. A resin composition comprising
    a) 30 to 70% by weight of a reaction product of
        a1) one or more epoxy compounds having at least two epoxy groups,
        and
        a2) sorbic acid
        as component A;
    b) 30 to 70% by weight of a solvent containing vinyl groups as component B; wherein a bisphenol F diglycidyl ether or an epoxy novolac is used as epoxy compound component a1) in component A, wherein the sum of components A and B adds up to 100% by weight, and wherein the resin composition excludes unsaturated polyester resin.
2. A resin composition according to claim 1, wherein the epoxy groups in component A are reacted fully with sorbic acid.
3. A resin composition according to claim 1, wherein the solvent containing vinyl groups in component B is selected from the group consisting of acrylates of monoalcohols, diols and polyols, and of methacrylates of monoalcohols, diols and polyols.
4. A coating composition comprising
    i) 100 parts by weight of a resin composition according to claim 1, and
    ii) 1 to 3 parts by weight of a free-radical-forming polymerization initiator.

* * * * *